(12) United States Patent
Kim

(10) Patent No.: US 12,249,363 B2
(45) Date of Patent: Mar. 11, 2025

(54) METHOD AND APPARATUS FOR CONTROLLING REFRESH PERIOD OF EXTENDED MEMORY POOL

(71) Applicant: ELECTRONICS AND TELECOMMUNICATIONS RESEARCH INSTITUTE, Daejeon (KR)

(72) Inventor: Seon-Young Kim, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 170 days.

(21) Appl. No.: 17/980,818

(22) Filed: Nov. 4, 2022

(65) Prior Publication Data

US 2023/0238044 A1 Jul. 27, 2023

(30) Foreign Application Priority Data

Jan. 26, 2022 (KR) ......................... 10-2022-0011535

(51) Int. Cl.
*G11C 11/406* (2006.01)

(52) U.S. Cl.
CPC ... *G11C 11/40611* (2013.01); *G11C 11/40622* (2013.01); *G11C 11/40626* (2013.01)

(58) Field of Classification Search
CPC ........... G11C 11/40611; G11C 11/4062; G11C 11/40626

See application file for complete search history.

(56) References Cited

U.S. PATENT DOCUMENTS

| | | | |
|---|---|---|---|
| 6,219,724 B1 | 4/2001 | Kim et al. | |
| 7,075,847 B2 | 7/2006 | Kim et al. | |
| 9,792,974 B2 | 10/2017 | Ha et al. | |
| 2008/0072116 A1 | 3/2008 | Brittain et al. | |
| 2014/0192583 A1* | 7/2014 | Rajan | G11C 7/10 365/63 |
| 2015/0242308 A1 | 8/2015 | Kim et al. | |
| 2019/0042122 A1 | 2/2019 | Schmisseur et al. | |
| 2019/0196726 A1* | 6/2019 | Lee | G06F 3/0619 |
| 2020/0042197 A1* | 2/2020 | Kotra | G06F 3/0647 |
| 2021/0081312 A1 | 3/2021 | Coury et al. | |
| 2021/0201987 A1 | 7/2021 | Deng et al. | |
| 2021/0311646 A1 | 10/2021 | Malladi et al. | |
| 2021/0325954 A1 | 10/2021 | Guim Bernat et al. | |
| 2022/0051744 A1* | 2/2022 | Huang | G11C 29/4401 |
| 2022/0293166 A1* | 9/2022 | Ayyapureddi | G11C 11/40611 |

FOREIGN PATENT DOCUMENTS

| | | |
|---|---|---|
| KR | 10-2005-0082579 | 8/2005 |
| KR | 10-2010-0065446 | 6/2010 |
| KR | 10-2016-0092111 | 8/2016 |
| KR | 10-2020-0143922 | 12/2020 |
| KR | 10-2021-0147976 | 12/2021 |

* cited by examiner

*Primary Examiner* — Min Huang
(74) *Attorney, Agent, or Firm* — KILE PARK REED & HOUTTEMAN PLLC

(57) ABSTRACT

Disclosed herein is a method for controlling a refresh period of an extension memory pool. The method includes collecting information about each of preset unit DRAM cell sets of an extension memory pool, setting an initial refresh period for each of the DRAM cell sets, and adjusting the refresh period based on the information collected from the DRAM cell sets.

14 Claims, 6 Drawing Sheets

METHOD AND APPARATUS FOR CONTROLLING REFRESH PERIOD OF EXTENDED MEMORY POOL

CROSS REFERENCE TO RELATED APPLICATION

This application claims the benefit of Korean Patent Application No. 10-2022-0011535, filed Jan. 26, 2022, which is hereby incorporated by reference in its entirety into this application.

BACKGROUND OF THE INVENTION

1. Technical Field

The present disclosure relates generally to a method and apparatus for controlling a refresh period of an extended memory pool for reducing power consumption.

More particularly, the present disclosure relates to technology for controlling a refresh period in consideration of the reliability and the real-time temperature of memory included in an extended memory pool and of whether a real-time error occurs.

2. Description of the Related Art

Recently, fields of using big data, including fields of Artificial Intelligence (AI) and cloud computing, have been largely expanded, which rapidly increases the size of data processed in computing systems. Accordingly, the capacity of memory required for systems is rapidly increasing, and in order to solve this problem, memory extension technology in which a system is allowed to use an extension memory pool as well as the local memory thereof is receiving a lot of attention.

However, as a system is equipped with terabytes or more of memory through memory extension technology, the amount of power consumed for memory accounts for a major proportion, unlike in existing computing structures in which the amount of power consumed for memory does not account for a large proportion.

DRAM, which is mainly used as memory in a system, has a characteristic in which data stored in a cell is erased after a certain time period due to leakage current, so requires a refresh operation for periodically charging electrodes in order to retain data stored in a cell. However, such a refresh operation consumes a large amount of power, which accounts for 25% or higher of the amount of power consumed by DRAM, and this percentage increases with an increase in the capacity of DRAM.

The refresh period of existing commercial DRAM is fixed to 64 msec, and this value is set for a cell having a shortest data retention time, among all of DRAM cells. Accordingly, a periodic refresh operation is unnecessarily performed on most other cells having a data retention time that is not short, which decreases the efficiency of a refresh operation in existing commercial DRAM.

Therefore, in order to reduce the amount of power consumed by memory in a system having an extension memory pool configured with DRAM, technology for efficiently performing a refresh operation, which accounts for a major proportion of the amount of power consumed for DRAM, is required.

DOCUMENTS OF RELATED ART (Patent Document 1) Korean Patent Application Publication No. 10-2016-0092111, titled "Memory system including plurality of DRAM devices operating selectively".

SUMMARY OF THE INVENTION

An object of the present disclosure is to provide a method for efficiently performing a refresh operation in order to reduce the amount of power consumed for an extension memory pool configured with DRAM.

Another object of the present disclosure is to provide a method for controlling a refresh period in consideration of the reliability of memory included in an extension memory pool, the real-time temperature thereof, and whether a real-time error occurs in order to enhance the reliability of the extension memory pool.

In order to accomplish the above objects, a method for controlling a refresh period of an extension memory pool according to an embodiment of the present disclosure includes collecting information about each of preset unit DRAM cell sets of the extension memory pool, setting an initial refresh period for each of the DRAM cell sets, and adjusting the refresh period based on the information collected from the DRAM cell sets.

Here, the initial refresh period may be set based on the data retention time of a DRAM cell having a shortest data retention time, among DRAM cells in the unit DRAM cell set.

Here, the information about each of the preset unit DRAM cell sets may include information about the address of a weak row including a DRAM cell having a short data retention time and information about the address of a safe row configured with DRAM cells having a long data retention time.

Here, the method may further include remapping memory access to the weak row to the safe row.

Here, remapping the memory access may be performed based on a result of comparison of an accessed memory address with the address of the weak row.

Here, collecting the information about each of the preset unit DRAM cell sets may comprise collecting temperatures of the unit DRAM cell sets and information about whether an error occurs.

Here, adjusting the refresh period may comprise, when an error occurs in a specific DRAM cell, decreasing the refresh period of a unit DRAM cell set including the DRAM cell in which the error occurs.

Here, adjusting the refresh period may comprise again decreasing the refresh period of the unit DRAM cell set when an error occurs again within a preset time period based on the adjusted refresh period; and increasing the refresh period of the unit DRAM cell set when no error occurs within the preset time period.

Here, adjusting the refresh period may be performed using a count bit value.

Here, adjusting the refresh period may comprise, when the temperature of a specific section in the DRAM is higher than a preset temperature, comparing the refresh period of a unit DRAM cell set including the specific section, in which the temperature is higher than the preset temperature, with a preset threshold-temperature-based period and adjusting the refresh period.

Also, in order to accomplish the above objects, an apparatus for controlling a refresh period of an extension memory pool according to an embodiment of the present disclosure includes a storage unit for collecting information about each of preset unit DRAM cell sets of the extension memory pool and a control unit for setting an initial refresh period for each of the DRAM cell sets and adjusting the initial refresh period based on the information collected from the DRAM cell sets.

Here, the initial refresh period may be set based on the data retention time of a DRAM cell having a shortest data retention time, among DRAM cells in the unit DRAM cell set.

Here, the information about each of the preset unit DRAM cell sets may include information about the address of a weak row including a DRAM cell having a short data retention time and information about the address of a safe row configured with DRAM cells having a long data retention time.

Here, the apparatus may further include a remapping unit for remapping memory access to the weak row to the safe row.

Here, the remapping unit may perform remapping based on a result of comparison of an accessed memory address with the address of the weak row.

Here, the storage unit may collect temperatures of the unit DRAM cell sets and information about whether an error occurs.

Here, when an error occurs in a specific DRAM cell, the control unit may decrease the refresh period of a unit DRAM cell set including the DRAM cell in which the error occurs.

Here, the control unit may again decrease the refresh period of the unit DRAM cell set when an error occurs again within a preset time period based on the adjusted refresh period, and may increase the refresh period of the unit DRAM cell set when no error occurs within the preset time period.

Here, the control unit may adjust the refresh period using a count bit value.

Here, when the temperature of a specific section in the DRAM is higher than a preset temperature, the control unit may compare the refresh period of a unit DRAM cell set including the specific section, in which the temperature is higher than the preset temperature, with a preset threshold-temperature-based period and adjust the refresh period.

BRIEF DESCRIPTION OF THE DRAWINGS

The above and other objects, features, and advantages of the present disclosure will be more clearly understood from the following detailed description taken in conjunction with the accompanying drawings, in which.

DESCRIPTION OF THE PREFERRED EMBODIMENTS

Figure 1:
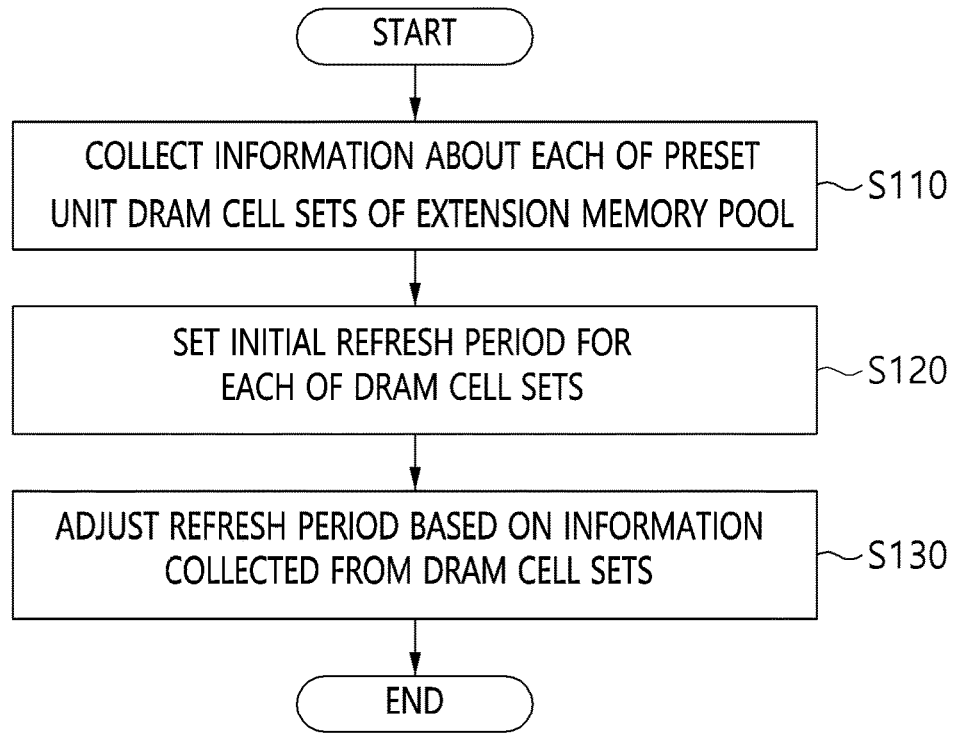
FIG. 1 is a flowchart illustrating a method for controlling a refresh period of an extension memory pool according to an embodiment of the present disclosure.

The advantages and features of the present disclosure and methods of achieving the same will be apparent from the exemplary embodiments to be described below in more detail with reference to the accompanying drawings. However, it should be noted that the present disclosure is not limited to the following exemplary embodiments, and may be implemented in various forms. Accordingly, the exemplary embodiments are provided only to disclose the present disclosure and to let those skilled in the art know the category of the present disclosure, and the present disclosure is to be defined based only on the claims. The same reference numerals or the same reference designators denote the same elements throughout the specification.

It will be understood that, although the terms "first," "second," etc. may be used herein to describe various elements, these elements are not intended to be limited by these terms. These terms are only used to distinguish one element from another element. For example, a first element discussed below could be referred to as a second element without departing from the technical spirit of the present disclosure.

The terms used herein are for the purpose of describing particular embodiments only, and are not intended to limit the present disclosure. As used herein, the singular forms are intended to include the plural forms as well, unless the context clearly indicates otherwise. It will be further understood that the terms "comprises," "comprising,", "includes" and/or "including," when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present disclosure pertains. Terms identical to those defined in generally used dictionaries should be interpreted as having meanings identical to contextual meanings of the related art, and are not to be interpreted as having ideal or excessively formal meanings unless they are definitively defined in the present specification.

Hereinafter, embodiments of the present disclosure will be described in detail with reference to the accompanying drawings. In the following description of the present disclosure, the same reference numerals are used to designate the same or similar elements throughout the drawings, and repeated descriptions of the same components will be omitted.

FIG. 1 is a flowchart illustrating a method for controlling a refresh period of an extension memory pool according to an embodiment of the present disclosure.

Referring to FIG. 1, the method for controlling a refresh period of an extension memory pool according to an embodiment includes collecting information about each of preset unit DRAM cell sets of an extension memory pool at step S110, setting an initial refresh period for each of the DRAM cell sets at step S120, and adjusting the refresh period based on the information collected from the DRAM cell sets at step S130.

Here, the initial refresh period may be set based on the data retention time of a DRAM cell having the shortest retention time, among DRAM cells in the unit DRAM cell set.

Here, the information about each of the preset unit DRAM cell sets may include information about the address of a weak row including a DRAM cell having a short data retention time and information about the address of a safe row configured with DRAM cells having a long data retention time.

Here, the method for controlling a refresh period may further include remapping memory access to the weak row to the safe row.

Here, remapping the memory access may be performed based on a result of comparison of an accessed memory address with the address of the weak row.

Here, collecting the information about each of the preset unit DRAM cell sets at step S110 may comprise collecting the temperatures of the DRAM cell sets and information about whether an error occurs.

Here, collecting the temperatures of the unit DRAM cell sets and information about whether an error occurs may be performed for a unit greater than a unit DRAM cell set, e.g., for each DRAM module unit, and the scope of the present disclosure is not limited to the unit for which temperature is measured.

Here, adjusting the refresh period at step S130 may comprise, when an error occurs in a specific DRAM cell, decreasing the refresh period of a unit DRAM cell set including the DRAM cell in which the error occurred.

Here, adjusting the refresh period at step S130 may comprise again decreasing the refresh period of the unit DRAM cell set when an error again occurs within a preset time period based on the adjusted refresh period and increasing the refresh period of the unit DRAM cell set when no error occurs within the preset time period.

Here, adjusting the refresh period at step S130 may be performed using a count bit value.

Here, adjusting the refresh period at step S130 may comprise, when the temperature of a specific section in the DRAM becomes higher than a preset temperature, comparing the refresh period of a unit DRAM cell set including the specific section, in which the temperature becomes higher than the preset temperature, with a preset threshold-temperature-based period and adjusting the refresh period.

Figure 2:
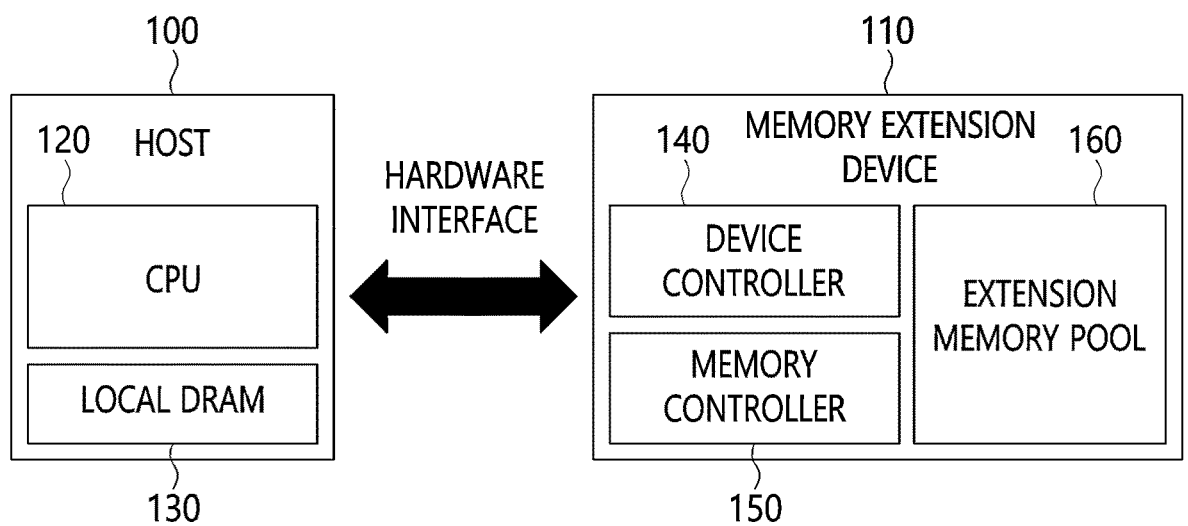
FIG. 2 is a view illustrating a system structure including an extension memory pool according to an embodiment of the present disclosure.

FIG. 2 is a view illustrating a system structure including an extension memory pool according to an embodiment of the present disclosure.

Referring to FIG. 2, a system having an extension memory pool is configured with a host 100 that uses the extension memory pool 160 by accessing the same and a memory extension device 110, which is a device for connecting the extension memory pool 160 with the host 100.

The host 100 is configured with a CPU 120 and local DRAM 130, and accesses the memory extension device 110 through a hardware interface, such as PCIe or CCIX, in order to secure an additional memory capacity in addition to the local DRAM 130, thereby using the extension memory pool 160 as if it were the local memory thereof.

The memory extension device 110 is configured with a device controller 140 for controlling the memory extension device 110, a memory controller 150 for controlling the extension memory pool 160, and the extension memory pool 160. Because the memory extension device 110 is commonly implemented through a Field-Programmable Gate Array (FPGA), it is easy to implement an additional function required by a user, such as the refresh period control method of the present disclosure.

Figure 3:
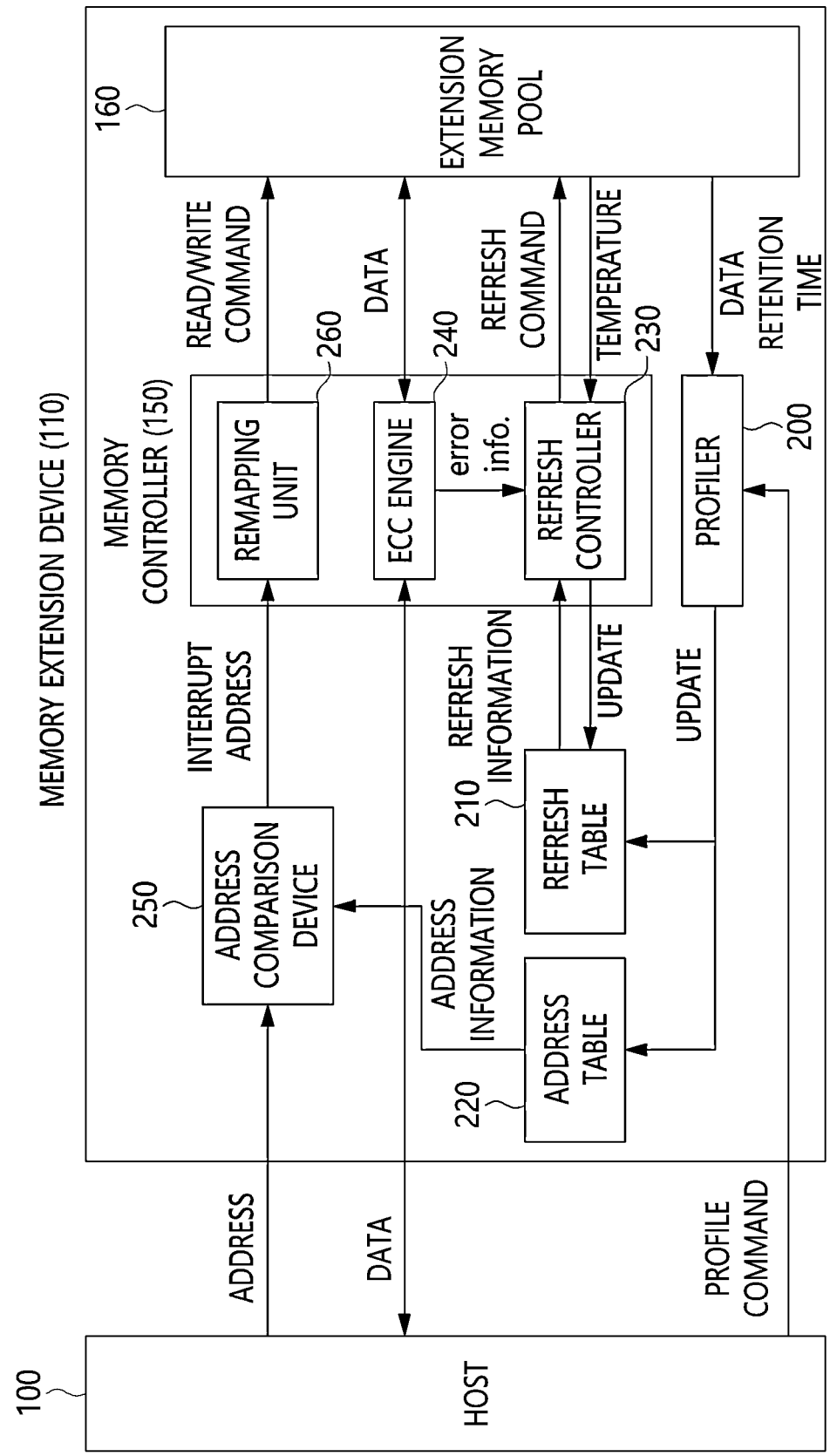
FIG. 3 is a block diagram illustrating in detail an apparatus for controlling a refresh period according to an embodiment of the present disclosure.

FIG. 3 is a block diagram illustrating in detail an apparatus for controlling a refresh period according to an embodiment of the present disclosure.

Referring to FIG. 3, the apparatus for controlling a refresh period according to the present disclosure may be implemented in a memory extension device 110 for increasing the memory capacity of a host 100.

Here, the apparatus for controlling a refresh period is configured with a profiler 200, a refresh table 210, an address table 220, a refresh controller 230, an ECC engine 240, an address comparison device 250, and a remapping unit 260. The refresh controller 230, the ECC engine 240, and the remapping unit 260 may be located in a memory controller 150.

The profiler 200 profiles the data retention time of each of preset unit DRAM cell sets for DRAM constituting an extension memory pool 160. Here, a unit DRAM cell set indicates a set of DRAM cells on which a refresh operation is performed by the same refresh command. The memory controller 150 may issue a refresh command to DRAM in any of various methods, such as per-bank refresh for performing a refresh operation for each DRAM bank, a rank-level refresh or all-bank refresh for performing a refresh operation for each DRAM rank, and the like. Therefore, a unit DRAM cell set may be variously defined according to the implementation method of the present disclosure.

The profiler 200 stores the profiled information in the refresh table 210, and the stored information is the address of each unit DRAM cell set and the initial refresh period value of the unit DRAM cell set. The initial refresh period value is set based on a cell having the shortest data retention time, among DRAM cells included in the unit DRAM cell set.

For example, when the data retention time of the cell having the shortest data retention time, among the cells in the unit DRAM cell set, is 70 msec, the initial refresh period value of the unit DRAM cell set may be set to 64 msec.

The profiler 200 also profiles the address of a weak row, which is a DRAM row including a weak cell, and stores the same in the address table 220. Here, the weak cell indicates a DRAM cell having a data retention time shorter than the minimum refresh period set by a user. For example, when a user sets the minimum value of the refresh period to apply to an extension memory pool to 128 msec, a cell having a data retention time shorter than 128 msec is a weak cell, and a DRAM row including the cell is a weak row.

The minimum refresh period is set longer than a value set as the refresh period of existing commercial DRAM (e.g., 64 msec). This is for reducing the amount of power consumed for DRAM by reducing the number of times a refresh operation is performed, compared to the existing DRAM. For example, when the minimum refresh period is set to 128 msec, the number of refresh operations is reduced to half the number of refresh operations performed when the refresh period is 64 msec, which is a commonly used refresh period in DRAM, whereby the power consumption for the refresh operation may be theoretically reduced to half.

The profiler 200 also profiles the address of a safe row configured with reliable DRAM cells and stores the same in the address table 220 so as to correspond to the address of the weak row. That is, the address of a safe row corresponding to the address of each weak row is also present in the address table 220. All of the DRAM cells included in the safe row have a data retention time longer than the minimum refresh period.

The initial refresh period value for each unit DRAM cell set stored in the above-mentioned refresh table 210 is set so as not to be less than the minimum refresh period. If a certain unit DRAM cell set includes a weak row, the initial refresh period value of the unit DRAM cell set is set to the minimum refresh period.

The time at which the profiler 200 performs profiling may be variously defined, such as the time predefined by the host 100 (e.g., each time the system boots) or the time at which the host 100 transfers a profile command.

The refresh controller 230 issues a refresh command at every period set for each unit DRAM cell set by referring to the refresh table 210. The initial value of the refresh period of each unit DRAM cell set is the initial refresh period value of each unit DRAM cell set, which is stored in the refresh table 210 by the profiler 200.

The refresh controller 230 monitors, in real time, the temperature of DRAM included in the extension memory pool 160 and whether an error occurs, thereby dynamically adjusting a period of issuing a refresh command. When the period of issuing a refresh command is adjusted, the refresh controller 230 updates the refresh table 210 with the adjusted period. The method of adjusting a refresh period, performed by the refresh controller 230, will be described in detail with reference to FIG. 4 and FIG. 5.

In order to ensure the reliability of DRAM in the extension memory pool 160, the ECC engine 240 generates an Error Correction Code (ECC) of data and stores the same in DRAM along with the data when a write command is executed, and reads the ECC along with the data when a read command is executed, thereby verifying the integrity of the data. If an error occurs in the data in the verification process, the ECC engine 240 recovers the error and notifies the refresh controller 230 of the occurrence of the error.

The ECC used by the ECC engine 240 in the present disclosure is not limited to a specific form of code, and may be implemented in any of various forms, such as a parity code, a hamming code, a Reed-Solomon (RS) code, and the like.

When the host accesses a weak row, the address comparison device 250 refers to the address table 220 and notifies the remapping unit 260 of the access to the weak row through an interrupt signal. The remapping unit 260 remaps the access to the weak row, which is announced by the address comparison device 250, to access to a safe row corresponding to the weak row. The operation methods of the address comparison device 250 and the remapping unit 260 will be described in detail later with reference to FIG. 6.

Figure 4:
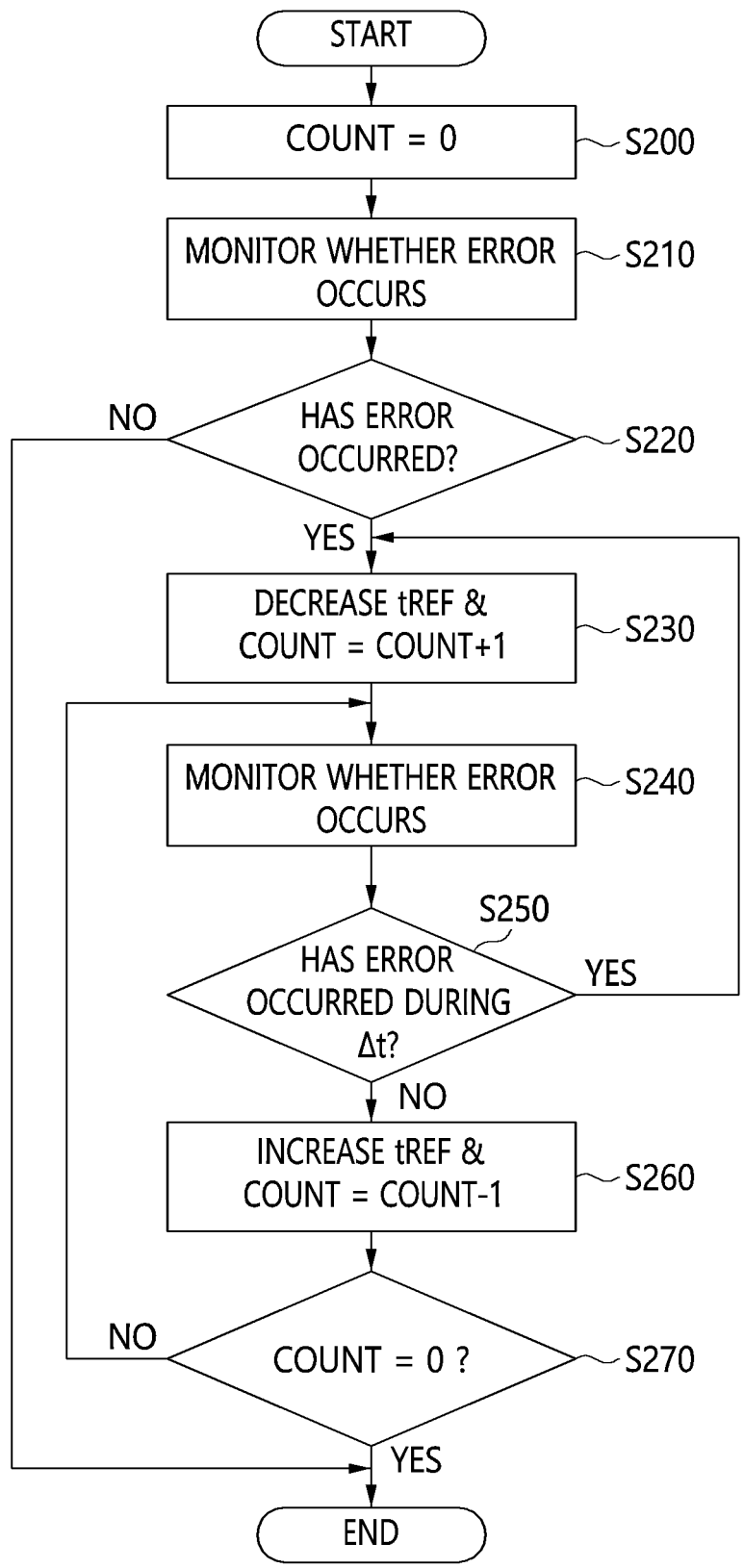
FIG. 4 is a flowchart illustrating a method of adjusting a refresh period depending on whether a real-time error occurs in DRAM.

FIG. 4 is a flowchart illustrating a method of adjusting a refresh period depending on whether a real-time error occurs in DRAM.

Here, the step of adjusting a refresh period depending on whether a real-time error occurs in DRAM may be performed by the refresh controller 230 of FIG. 3. Here, the method of dynamically adjusting a refresh period is applied to each unit DRAM cell set, and may be performed in parallel in all of the unit DRAM cell sets.

First, the refresh controller 230 initializes a count bit, which gives information about the difference between the current refresh period of a unit DRAM cell set and the initial refresh period value thereof, to 0 at step S200. Subsequently, the refresh controller 230 monitors whether an error occurs in the unit DRAM cell set through the ECC engine 240 at step S210. When an error occurs in a certain cell at step S220, the refresh period of the unit DRAM cell set including the cell is decreased by one level, and the value of the count bit is increased by 1 at step S230. The refresh controller 230 adjusts the refresh period using the value of tREF, which is a parameter indicating the refresh period.

The unit by which the refresh controller 230 adjusts a refresh period may vary depending on the implementation method of the present disclosure. For example, when a user sets a refresh period adjustment unit to 32 msec and when the previous refresh period was 64 msec, if the refresh period is decreased by one level, the refresh period changes to 32 msec.

Even after it adjusts the refresh period, the refresh controller 230 continues to monitor whether an error occurs in the corresponding unit DRAM cell set at step S240. If an error occurs again in the corresponding unit DRAM cell set within a certain time period Δt, the process returns to the step (S230) of decreasing the refresh period by one level. If no error occurs in the corresponding unit DRAM cell set within the time period Δt, the refresh period of the corresponding unit DRAM cell set is increased by one level, and the value of the count bit is decreased by 1 at step S260. Subsequently, whether the value of the count bit of the corresponding unit DRAM cell set is 0 is checked at step S270, and when the value is not 0, the process returns to the step (S240) of monitoring whether an error occurs. When the value is 0, the process moves to a termination step. The method of dynamically adjusting a refresh period illustrated in FIG. 4 is restarted from the initial step immediately after the process is terminated.

Figure 5:
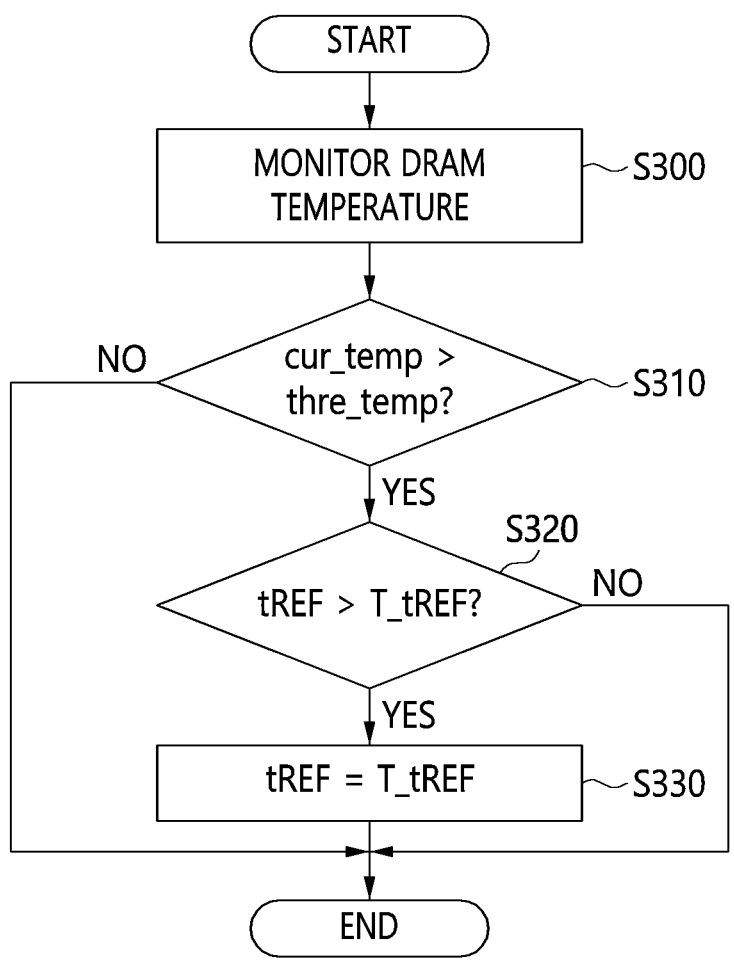
FIG. 5 is a flowchart illustrating a method of adjusting a refresh period depending on the real-time temperature of DRAM.

FIG. 5 is a flowchart illustrating a method of adjusting a refresh period depending on the real-time temperature of DRAM.

Here, the step of adjusting a refresh period depending on the real-time temperature of DRAM may be performed by the refresh controller 230 illustrated in FIG. 3. Here, the method of dynamically adjusting a refresh period is applied to each unit DRAM cell set, and may be performed in parallel in all of the unit DRAM cell sets.

Referring to FIG. 5, the refresh controller 230 monitors temperature information of the extension memory pool 160 by receiving the same from temperature sensors in the extension memory pool 160 at step S300. If the value of a specific temperature sensor is higher than a threshold temperature thre_temp at step S310, the current refresh period of a unit DRAM cell set included in the corresponding area is compared with a predefined threshold-temperature-based period value T_tREF. When the current refresh period value of the corresponding unit DRAM cell set is greater than the threshold-temperature-based period value at step S320, the refresh period of the corresponding unit DRAM cell set is changed to the threshold-temperature-based period value at step S330. If the refresh period of the corresponding unit DRAM cell set is already decreased as the result of application of the method of dynamically adjusting a refresh period depending on whether an error occurs, illustrated in FIG. 4, the process may move to a termination step without adjusting the refresh period. The method of dynamically adjusting a refresh period illustrated in FIG. 5 is restarted from the initial step immediately after the process is terminated.

Figure 6:
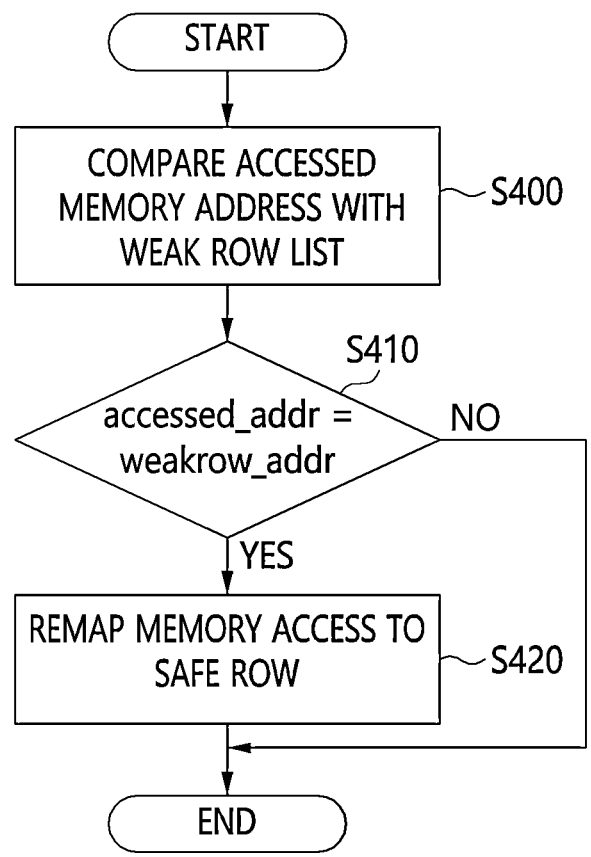
FIG. 6 is a flowchart illustrating a process of remapping memory access to a weak row to a safe row.

FIG. 6 is a flowchart illustrating a process of remapping memory access to a weak row to a safe row.

When a host 100 accesses an extension memory pool 160, an address comparison device 250 compares the memory address to which the host 100 intends to access with an address of a weak row stored in an address table 220 at step S400. When an address of a weak row that is the same as the memory address to which the host 100 intends to access is present at step S410, the memory access is remapped to access to a safe row corresponding to the weak row at step S420. That is, the access to the address of the weak row is remapped to access to the address of the safe row. If an address corresponding to the memory address to which the host 100 intends to access is not present in the weak row list of the address table 220, the process moves to a termination step. The address remapping method illustrated in FIG. 6 is applied to all accesses by the host to the extension memory pool 160.

When the address remapping method illustrated in FIG. 6 is applied, an increase in the number of weak rows causes overhead in terms of the capacity of the extension memory pool 160. However, because a very small number of weak cells is present in a DRAM module (generally 1000 or fewer weak cells are present in a DRAM module having a capacity of 32 GB), even though the address remapping method of FIG. 6 is applied, the overhead in terms of the capacity is insignificant.

Even though the above-mentioned minimum refresh period value is set long through the address remapping method of FIG. 6, the reliability of the extension memory pool 160 may be maintained. Accordingly, the number of times a refresh operation is performed is decreased compared to existing commercial DRAM, whereby the amount of power consumed by the extension memory pool 160 may be significantly decreased while ensuring the same level of reliability as existing commercial DRAM.

Figure 7:
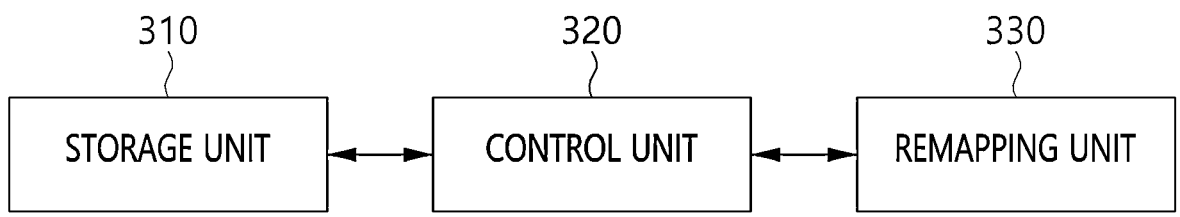
FIG. 7 is a block diagram illustrating an apparatus for controlling a refresh period of an extension memory pool according to an embodiment of the present disclosure.

FIG. 7 is a block diagram illustrating an apparatus for controlling a refresh period of an extension memory pool according to an embodiment of the present disclosure.

Referring to FIG. 7, the apparatus for controlling a refresh period of an extension memory pool according to an embodiment includes a storage unit 310 for collecting information about each of preset unit DRAM cell sets of an extension memory pool and a control unit 320 for setting the initial refresh period for each of the DRAM cell sets and adjusting the initial refresh period based on the information collected from the DRAM cell sets.

Here, the initial refresh period may be set based on the data retention time of a DRAM cell having the shortest retention time, among DRAM cells in the unit DRAM cell set.

Here, the information about each of the preset unit DRAM cell sets may include information about the address of a weak row including a DRAM cell having a short data retention time and information about the address of a safe row configured with DRAM cells having a long data retention time.

Here, the apparatus for controlling a refresh period may further include a remapping unit 330 for remapping memory access to the weak row to the safe row.

Here, the remapping unit 330 may perform remapping based on the result of comparison of the accessed memory address with the address of the weak row.

Here, the storage unit 310 may collect the temperatures of the unit DRAM cell sets and information about whether an error occurs.

Here, when an error occurs in a specific DRAM cell, the control unit 320 may decrease the refresh period of the unit DRAM cell set including the DRAM cell in which the error occurs.

Here, when an error occurs again within a preset time period based on the adjusted refresh period, the control unit 320 may again decrease the refresh period of the unit DRAM cell set, whereas when no error occurs within the preset time period, the control unit 320 may increase the refresh period of the unit DRAM cell set.

Here, the control unit 320 may adjust the refresh period using a count bit value.

Here, when the temperature of a specific section in the DRAM is higher than a preset temperature, the control unit 320 may compare the refresh period of the unit DRAM cell set including the specific section, in which the temperature is higher than the preset temperature, with a preset threshold-temperature-based period and adjust the refresh period.

Figure 8:
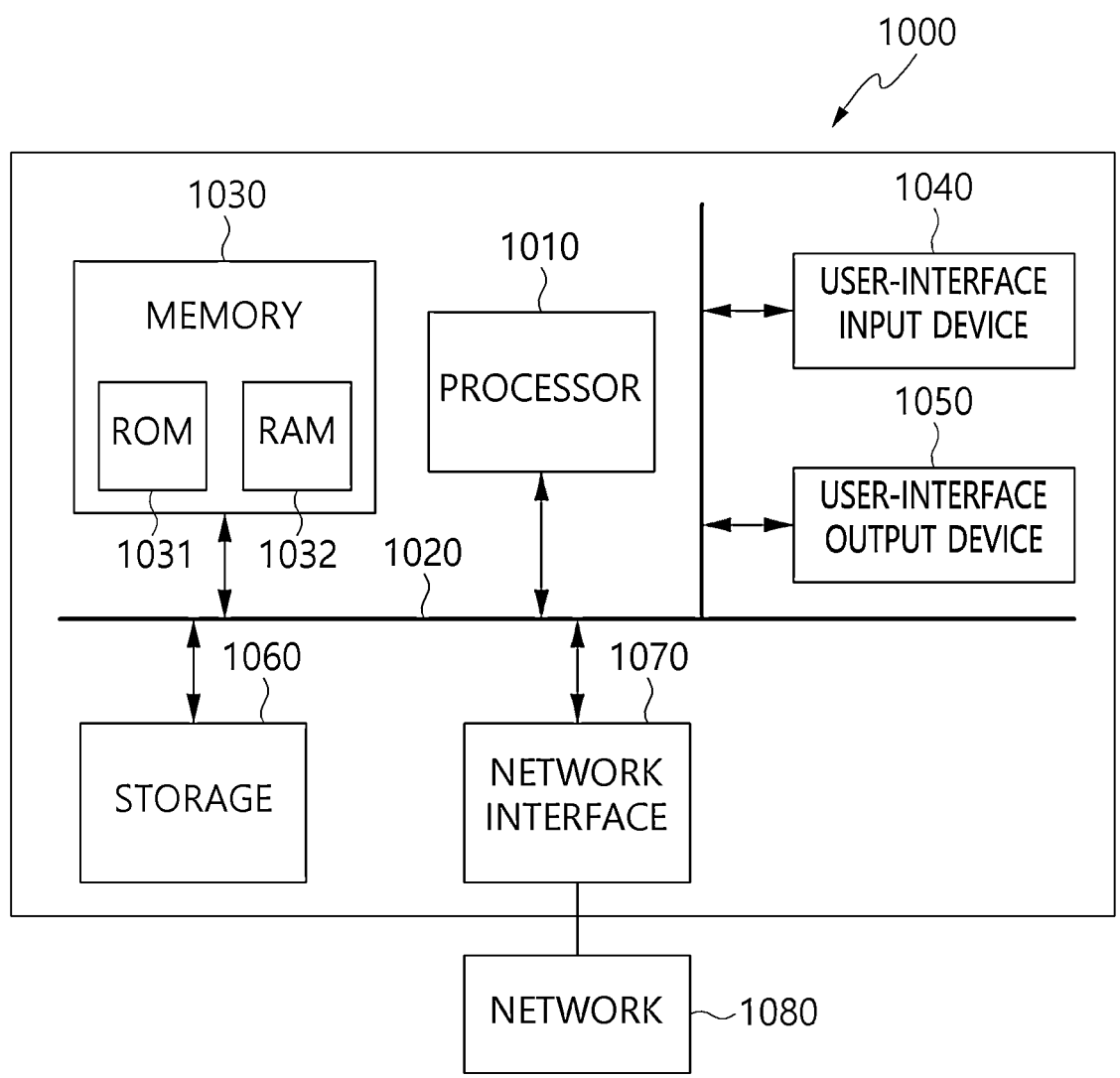
FIG. 8 is a view illustrating the configuration of a computer system according to an embodiment.

FIG. 8 is a view illustrating the configuration of a computer system according to an embodiment.

The apparatus for controlling a refresh period of an extension pool according to an embodiment may be implemented in a computer system 1000 including a computer-readable recording medium.

The computer system 1000 may include one or more processors 1010, memory 1030, a user-interface input device 1040, a user-interface output device 1050, and storage 1060, which communicate with each other via a bus 1020. Also, the computer system 1000 may further include a network interface 1070 connected to a network 1080. The processor 1010 may be a central processing unit or a semiconductor device for executing a program or processing instructions stored in the memory 1030 or the storage 1060. The memory 1030 and the storage 1060 may be storage media including at least one of a volatile medium, a non-volatile medium, a detachable medium, a non-detachable medium, a communication medium, or an information delivery medium, or a combination thereof. For example, the memory 1030 may include ROM 1031 or RAM 1032.

According to the present disclosure, a method for efficiently performing a refresh operation may be provided in order to reduce the amount of power consumed for an extension memory pool configured with DRAM.

Also, the present disclosure may significantly reduce power consumption by adjusting a refresh period in consideration of the reliability of memory included in an extension memory pool, the real-time temperature thereof, and whether a real-time error occurs.

Specific implementations described in the present disclosure are embodiments and are not intended to limit the scope of the present disclosure. For conciseness of the specification, descriptions of conventional electronic components, control systems, software, and other functional aspects thereof may be omitted. Also, lines connecting components or connecting members illustrated in the drawings show functional connections and/or physical or circuit connections, and may be represented as various functional connections, physical connections, or circuit connections that are capable of replacing or being added to an actual device. Also, unless specific terms, such as "essential", "important", or the like, are used, the corresponding components may not be absolutely necessary.

Accordingly, the spirit of the present disclosure should not be construed as being limited to the above-described embodiments, and the entire scope of the appended claims and their equivalents should be understood as defining the scope and spirit of the present disclosure.

What is claimed is:

1. A method for controlling a refresh period of an extension memory pool comprising:
    collecting information about each of preset unit DRAM cell sets of the extension memory pool;

setting an initial refresh period for each of the DRAM cell sets; and adjusting the refresh period based on the information collected from the DRAM cell sets, wherein collecting the information about each of the preset unit DRAM cell sets comprises collecting temperatures of the unit DRAM cell sets and information about whether an error occurs, and wherein adjusting the refresh period comprises:
when an error occurs in a specific DRAM cell, decreasing a refresh period of a unit DRAM cell set including the DRAM cell in which the error occurs,
again decreasing the refresh period of the unit DRAM cell set when an error occurs again within a preset time period based on the adjusted refresh period, and
increasing the refresh period of the unit DRAM cell set when no error occurs within the preset time period.

2. The method of claim 1, wherein
the initial refresh period is set based on a data retention time of a DRAM cell having a shortest data retention time, among DRAM cells in the unit DRAM cell set.

3. The method of claim 1, wherein the information about each of the preset unit DRAM cell sets includes information about an address of a weak row including a DRAM cell having a short data retention time and information about an address of a safe row configured with DRAM cells having a long data retention time.

4. The method of claim 3, further comprising:
remapping memory access to the weak row to the safe row.

5. The method of claim 4, wherein remapping the memory access is performed based on a result of comparison of an accessed memory address with the address of the weak row.

6. The method of claim 1, wherein adjusting the refresh period is performed using a count bit value.

7. The method of claim 1, wherein adjusting the refresh period comprises, when a temperature of a specific section in the DRAM is higher than a preset temperature, comparing a refresh period of a unit DRAM cell set including the specific section, in which the temperature is higher than the preset temperature, with a preset threshold-temperature-based period and adjusting the refresh period.

8. An apparatus for controlling a refresh period of an extension memory pool, comprising:

a storage unit for collecting information about each of preset unit DRAM cell sets of the extension memory pool; and a control unit for setting an initial refresh period for each of the DRAM cell sets and adjusting the refresh period based on the information collected from the DRAM cell sets, wherein the storage unit collects temperatures of the unit DRAM cell sets and information about whether an error occurs, wherein, when an error occurs in a specific DRAM cell, the control unit decreases a refresh period of a unit DRAM cell set including the DRAM cell in which the error occurs, wherein the control unit again decreases the refresh period of the unit DRAM cell set when an error occurs again within a preset time period based on the adjusted refresh period, and increases the refresh period of the unit DRAM cell set when no error occurs within the preset time period.

9. The apparatus of claim 8, wherein the initial refresh period is set based on a data retention time of a DRAM cell having a shortest data retention time, among DRAM cells in the unit DRAM cell set.

10. The apparatus of claim 8, wherein the information about each of the preset unit DRAM cell sets includes information about an address of a weak row including a DRAM cell having a short data retention time and information about an address of a safe row configured with DRAM cells having a long data retention time.

11. The apparatus of claim 10, further comprising:
a remapping unit for remapping memory access to the weak row to the safe row.

12. The apparatus of claim 11, wherein the remapping unit performs remapping based on a result of comparison of an accessed memory address with the address of the weak row.

13. The apparatus of claim 8, wherein the control unit adjusts the refresh period using a count bit value.

14. The apparatus of claim 8, wherein, when a temperature of a specific section in the DRAM is higher than a preset temperature, the control unit compares a refresh period of a unit DRAM cell set including the specific section, in which the temperature is higher than the preset temperature, with a preset threshold-temperature-based period and adjusts the refresh period.

* * * * *